United States Patent
Casper

(10) Patent No.: US 6,617,918 B2
(45) Date of Patent: Sep. 9, 2003

(54) MULTI-LEVEL RECEIVER CIRCUIT WITH DIGITAL OUTPUT USING A VARIABLE OFFSET COMPARATOR

(75) Inventor: Bryan K. Casper, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/968,349

(22) Filed: Sep. 28, 2001

(65) Prior Publication Data

US 2003/0011426 A1 Jan. 16, 2003

Related U.S. Application Data

(63) Continuation-in-part of application No. 09/895,625, filed on Jun. 29, 2001, now Pat. No. 6,420,932.

(51) Int. Cl.[7] .................................................. H03F 1/02
(52) U.S. Cl. .......................................... 330/9; 327/124
(58) Field of Search ............................ 330/9, 252, 258; 327/124, 307

(56) References Cited

U.S. PATENT DOCUMENTS

| | | | |
|---|---|---|---|
| 4,754,169 A | 6/1988 | Morris | |
| 4,987,327 A | 1/1991 | Fernandez et al. | |
| 5,563,598 A | 10/1996 | Hickling | |
| 5,796,301 A * | 8/1998 | Tanabe et al. | 330/9 |
| 5,940,235 A * | 8/1999 | Sasaki et al. | 360/67 |
| 6,194,965 B1 * | 2/2001 | Kruczkowski et al. | 330/258 |
| 6,252,454 B1 * | 6/2001 | Thompson et al. | 330/9 |
| 6,348,882 B1 | 2/2002 | Ciccone et al. | |
| 6,388,521 B1 | 5/2002 | Henry | |

* cited by examiner

*Primary Examiner*—Henry Choe
(74) *Attorney, Agent, or Firm*—Blakely, Sokoloff, Taylor & Zafman LLP

(57) ABSTRACT

A number of comparators are provided where each has a differential input coupled to receive a transmission line analog signal level. Each comparator has substantially variable offset that is controllable to represent a respective variable reference level, without requiring a separate input to receive a voltage reference level. An output of each comparator is to provide a value that represents a comparison between the transmission line analog signal level and the respective reference level.

18 Claims, 9 Drawing Sheets

CREATE A REPRESENTATION OF A MULTI-LEVEL RECEIVER IN WHICH THERE ARE A NUMBER OF VARIABLE OFFSET COMPARATORS EACH HAVING AN INPUT TO RECEIVE THE SAME TRANSMISSION LINE ANALOG SIGNAL LEVEL.
604

CREATE A REPRESENTATION OF A REFERENCE CALIBRATION UNIT WHOSE OUTPUT IS COUPLED TO AN OFFSET CONTROL INPUT OF EACH VOC AND WHOSE INPUT IS COUPLED TO THE OUTPUT OF EACH VOC.
608

FIG. 6

MULTI-LEVEL RECEIVER CIRCUIT WITH DIGITAL OUTPUT USING A VARIABLE OFFSET COMPARATOR

This is a continuation-in-part application of U.S. application Ser. No. 09/895,625 entitled "Variable Offset Amplifier Circuit" filed Jun. 29, 2001 (U.S. Pat. No. 6,420,932).

RELATED APPLICATIONS

Some of the subject matter in this application may be related to the material disclosed in the following U.S. applications of Casper and others (which are assigned to the same assignee as that of this application): Ser. No. 09/967,804, "Equalization of a Transmission Line Signal Using a Variable Offset Comparator", filed on the same date as the present application.

BACKGROUND

This invention is generally related to input/output (i.e., I/O) circuits and in particular to multi-level receiver circuits with digital outputs.

I/O circuits act as the interface between different logic functional units of an electrical system. The functional units may be implemented in separate integrated circuit dies (i.e., IC chips) of the system. These chips may be in separate IC packages that have been soldered to a printed wiring board (i.e., PWB). The chips communicate with each other over one or more conductive transmission lines. The transmission lines may be a parallel bus formed on a PWB, and they may be of the point-to-point or multi-drop variety. Alternatively, the transmission line may be a serial link such as a coaxial cable. In both cases, each chip has an I/O circuit that includes a driver and a receiver for transmitting and detecting symbols. The driver and receiver translate between on-chip signaling and signaling that is suitable for high speed transmission (e.g., at several hundred megabits per second and higher) over a transmission line. In a 'bidirectional link', the driver and receiver pair are connected to the same transmission line.

In multi-level data communications, each transmitted symbol can have one of three or more values. For example, each symbol in a four pulse amplitude modulation (i.e., 4 PAM) link may only be a 0, 1, 2, or 3. In contrast, each symbol in a binary communication link may only be 0 or 1. For the binary link, the two symbol values may be detected using a single comparator whose reference level is fixed at the midpoint between the 0 and 1 nominal signal levels. A single digital 'bit' at the output of the comparator yields the symbol value. In contrast, a 4 PAM multi-level receiver may use three comparators whose respective reference levels have been fixed with respect to the four nominal signal levels, such that four different signal levels can be discerned. A three-bit number that appears at the output of the comparators identifies any one of four detected symbol values. Since two bits can be used to represent four different values, an encoder may be added in the receiver to encode the three bit number into two bits, such that each symbol is detected as a two-bit number. This concept can be readily extended to communication links in which each symbol represents greater than two bits.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

FIG. 6 illustrates a flow diagram of an embodiment of a computer-implemented method for designing the multi-level receiver.

DETAILED DESCRIPTION

A multi-level receiver with a digital output is described which may be implemented at lower cost than conventional multi-level receivers, and that provides comparable and perhaps even superior performance. The receiver circuit has two or more variable offset comparators (i.e., VOCs). Each VOC is designed to have a substantially variable offset that is controllable to represent a respective variable reference level for that VOC. In other words, varying the reference of each VOC is performed by changing the VOC's offset. An output of each VOC is to provide a value that represents a comparison between a transmission line analog signal level and the respective reference level.

The term offset here refers to an imbalance in the internal circuitry and in the operation of the VOC. The offset is variable. While sweeping the offset from one extreme to another, the offset is said to be 'trimmed' to equal a known input signal level at approximately the point in time when the VOC output changes states. According to an embodiment, the VOC has a differential input to receive a differential voltage signal level but no separate input to receive a voltage reference level as the reference level is inherently provided in the VOC (and is controlled by changing the offset).

Figure 1:
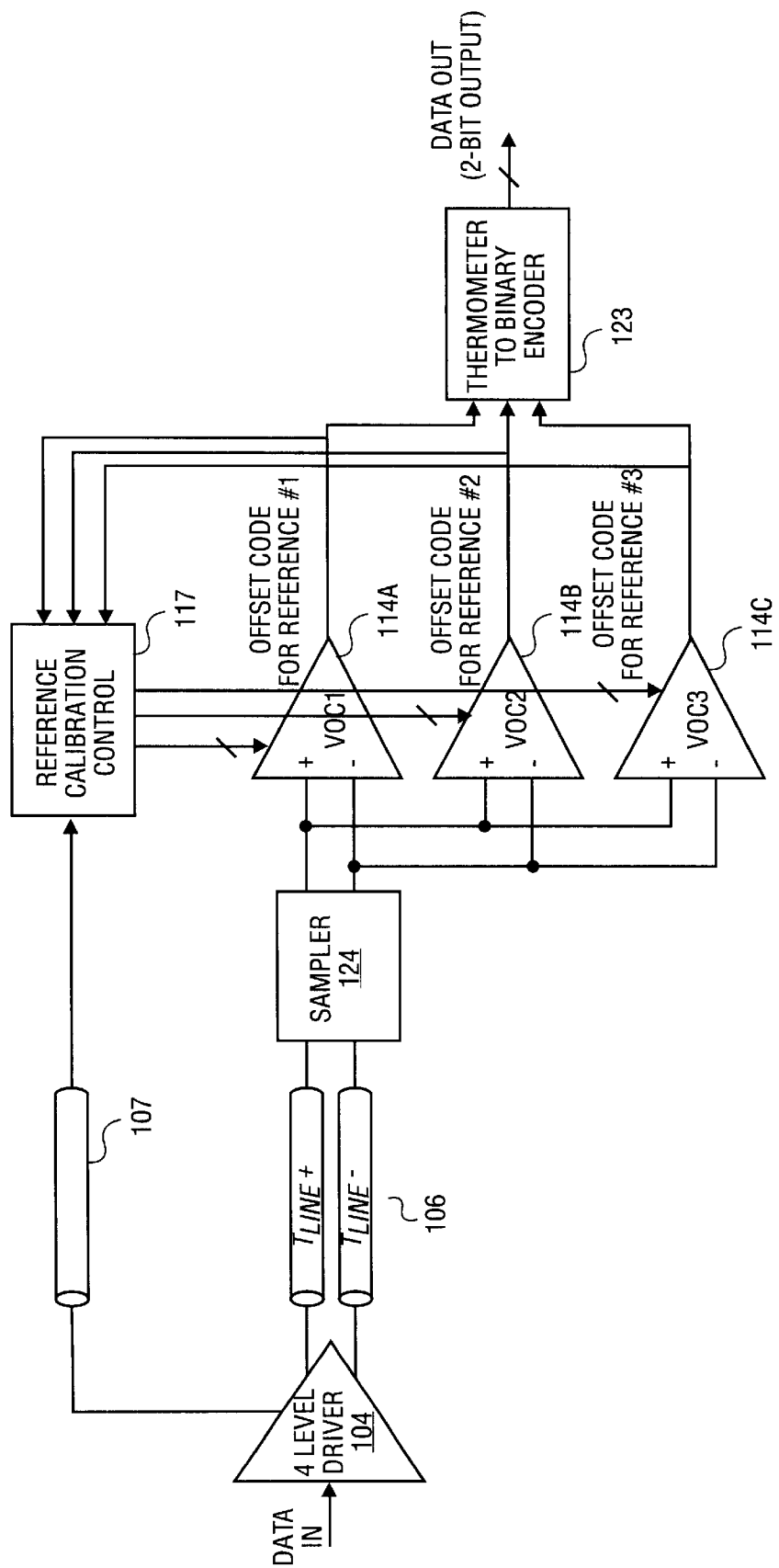
FIG. 1 shows a block diagram of an embodiment of the multi-level receiver.

FIG. 1 shows a block diagram of a high speed transmission link that features a driver 104 that drives a transmission line 106 with a multi-level transmission line analog signal. In multi-level communication links, the data may be transmitted in terms of symbols that represent two or more bits. The high speed transmission link may be operated according to a driver clock (not shown) which determines the rate at which symbols are transmitted into the transmission line 106. In this embodiment, a four level signal is driven. This is also referred to as a 4 PAM transmission link. Of course, the 4 PAM link described here is only an example as the multi-level receiver described here may be designed to work with transmission line signals having there or more levels.

An embodiment of the multi-level receiver circuit is also shown in FIG. 1. The circuit includes three VOCs 114a, 114b, and 114c each of which has an input coupled to receive the same transmission line analog signal level. In the embodiment shown, the VOC input and the analog signal are differential rather than single ended, to reduce common mode noise. Alternatively, however, a single ended VOC input coupled to receive a single ended transmission line signal may be used if the application can tolerate the higher common mode noise levels typically associated with single ended operation. An output of each VOC 114 is to provide a value that represents a comparison between the transmission line analog signal level and a respective reference level inherent in the VOC. Each VOC 114 has a substantially variable offset that is controllable to represent a respective variable reference level. In other words, varying the reference is performed by changing the offset of the VOC 114.

Figure 2:
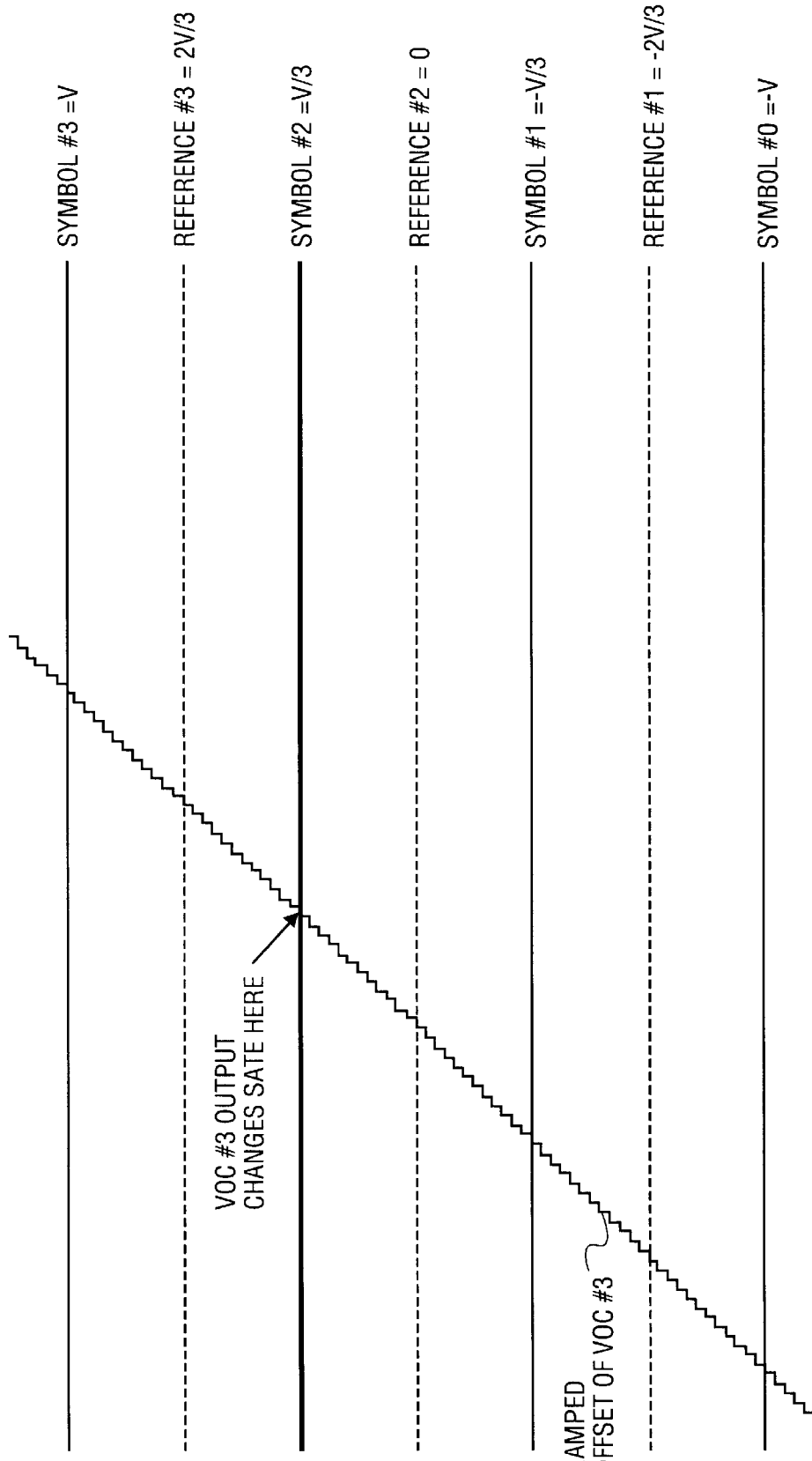
FIG. 2 depicts an embodiment of a waveform representing the offset of a variable offset comparator being ramped during a calibration process for the multi-level receiver.

In the 4 PAM example, each transmitted symbol can have any one of four different symbol values assigned to it. Each value is identified by a different signal level (e.g. voltage level) of the transmission line signal. FIG. 2 shows a diagram of an exemplary set of four voltages that correspond to symbols 0–3. To detect all four symbols using the VOCs 114 shown in FIG. 1, the offset of each VOC 114 is set so that each VOC has a different reference level as shown. This can be accomplished using a reference calibration control unit 117 whose output is coupled to an offset control input of each VOC 114. Inputs to the reference calibration control unit 117 are from the outputs of each VOC 114 as well as calibration information that may be received from the driver 104 via a low speed transmission line 107. Use of a separate low speed transmission line 107 may help avoid disturbing the high speed transmission link between the driver 104 and the VOCs 114. As an alternative, the calibration information, including the sequence of symbol values that will be transmitted during the calibration period, may be built into the unit 117 such that the unit 117 "knows" which symbols, though not the actual voltage levels, will be transmitted during the calibration period.

The calibration control unit 117 is able to calibrate the respective reference level of each VOC 114 to equal the reference levels indicated in FIG. 2. In the particular embodiment shown in FIG. 1, the offset control input of each VOC 114 is to receive a multi-bit binary number, known as an offset code, that sets the respective reference level. As an alternative, an analog signal may be used to set the respective reference level.

Referring to FIG. 2, what is depicted is an embodiment of a waveform representing the offset of a VOC 114 as it is being ramped during a reference calibration process. This ramp waveform may be generated using a conventional ramp generator that is part of the calibration control unit 117. In a digital implementation, the ramp generator may include a digital counter whose count output is the multi-bit offset code. In addition, a number of registers may be provided in the calibration control unit 117, where each register is coupled to store the count output in response to the output of a respective VOC changing states.

For the multi-level receiver to detect amplitude modulated data symbols of four levels, three voltage reference levels are needed to discern between four different symbol levels. An exemplary arrangement of the reference and symbol levels is shown in FIG. 2. The four exemplary symbol levels are −V, −V/3, +V/3, and +V volts. The three exemplary reference levels are −2V/3, 0, and +2V/3 volts. These three reference levels are generated inherently by the three VOCs 114a, 114b, and 114c, without a separate reference voltage input, each according to a different offset code. These offset codes are determined during a calibration period.

An embodiment of the calibration process may be summarized as follows. First, the VOCs are used to determine four offset codes, each of which equals a respective symbol value being transmitted. Thereafter, the three offset codes that equal the three respective references are computed, based on the idea that each reference level is at the midpoint of the voltage between two adjacent symbol levels (see FIG. 2). An exemplary calibration process is now described.

Figure 3A:
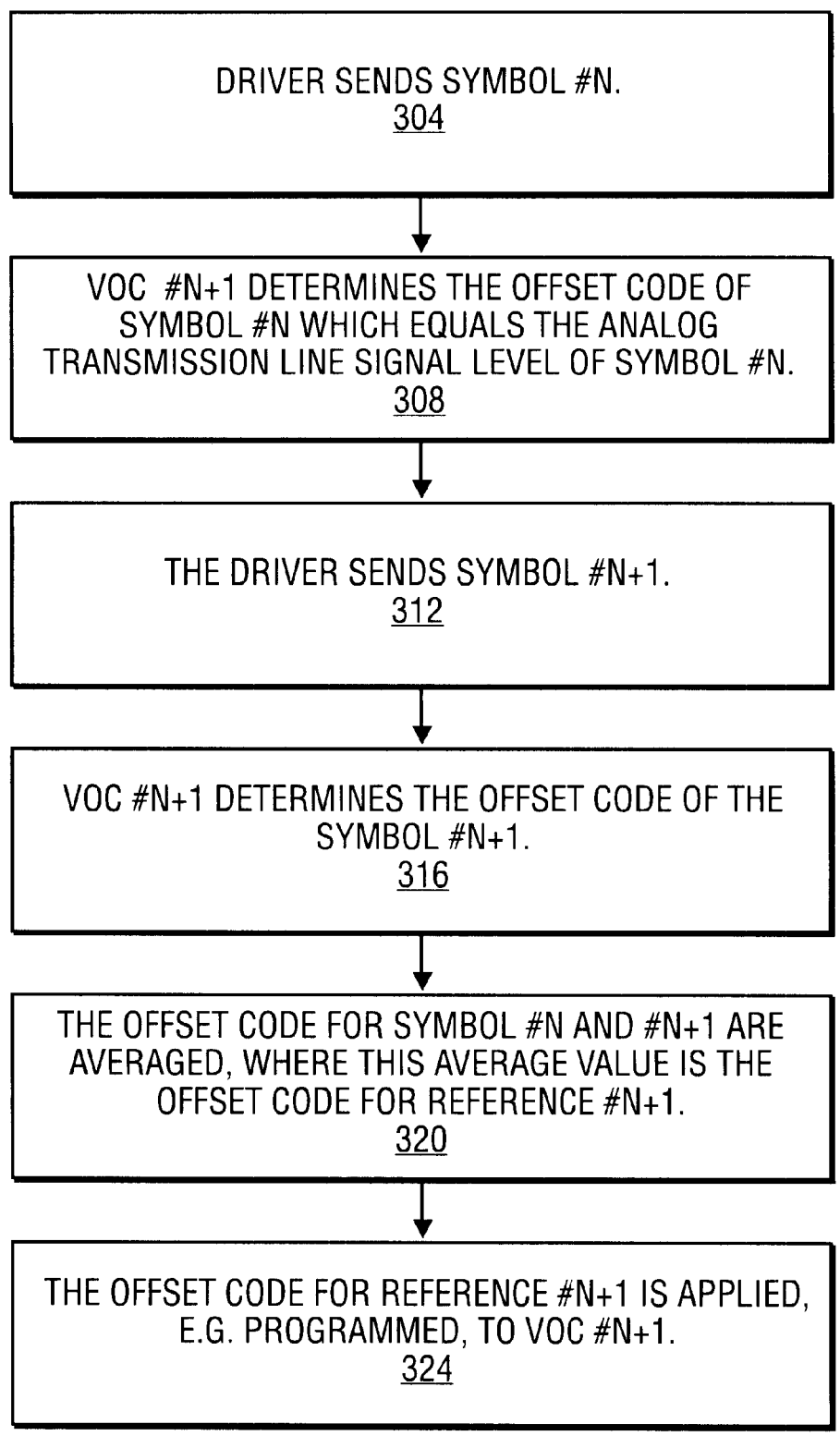
FIG. 3a illustrates a flow diagram of an embodiment of the reference calibration process.

Assume the driver 104 sends a symbol to the receiver. One of the VOCs will be used to determine the offset code that represents the value of the symbol being received. For example, assume the driver 104 sends symbol #2, as illustrated by, for instance, the emphasized line at +V/3 volts in FIG. 2. One possible way to determine the offset code that equals this symbol value is to start with applying the smallest offset code to the VOC, such that the VOC output is, for instance, logic '0'. The offset code should now be incremented by one step, while keeping constant the symbol level at the signal input of the VOC, and the VOC output should again be checked. This process should be repeated until the VOC output changes state to logic '1'. As soon as this change of state occurs on the VOC output, the offset code at that moment may be viewed as being equal to the symbol value being detected. A similar procedure can be performed for the remaining symbol values To illustrate the complete reference calibration process, FIG. 3 shows a flow diagram of an embodiment of such a process. The following description of this process also refers to the waveform shown in FIG. 2. The process begins with operation 304 in which the driver sends symbol #N where N may in this case be 0, 1, or 2. The analog transmission line signal level of this symbol may be provided to the input of the VOC either continuously or by being sampled and then held for the duration of the comparison that is performed in operation 308. In operation 308, VOC #N+1 determines the offset code that matches symbol #N. Operation 308 may be performed as described in the previous paragraph by ramping the offset code of VOC #N+1 until its output changes state. As an alternative, a binary search algorithm may be. implemented so that the matching offset code can be found more quickly. Next, the process continues with the driver sending symbol #N+1 (operation 312). The VOC #N+1 then determines the offset code of this symbol #N+1. The offset codes for symbol #N and #N+1 are then averaged to determine the offset code which equals reference #N+1 (operation 320). Finally, this offset code is stored and applied to (e.g. programmed into) VOC #N+1 (operation 324).

Figure 3B:
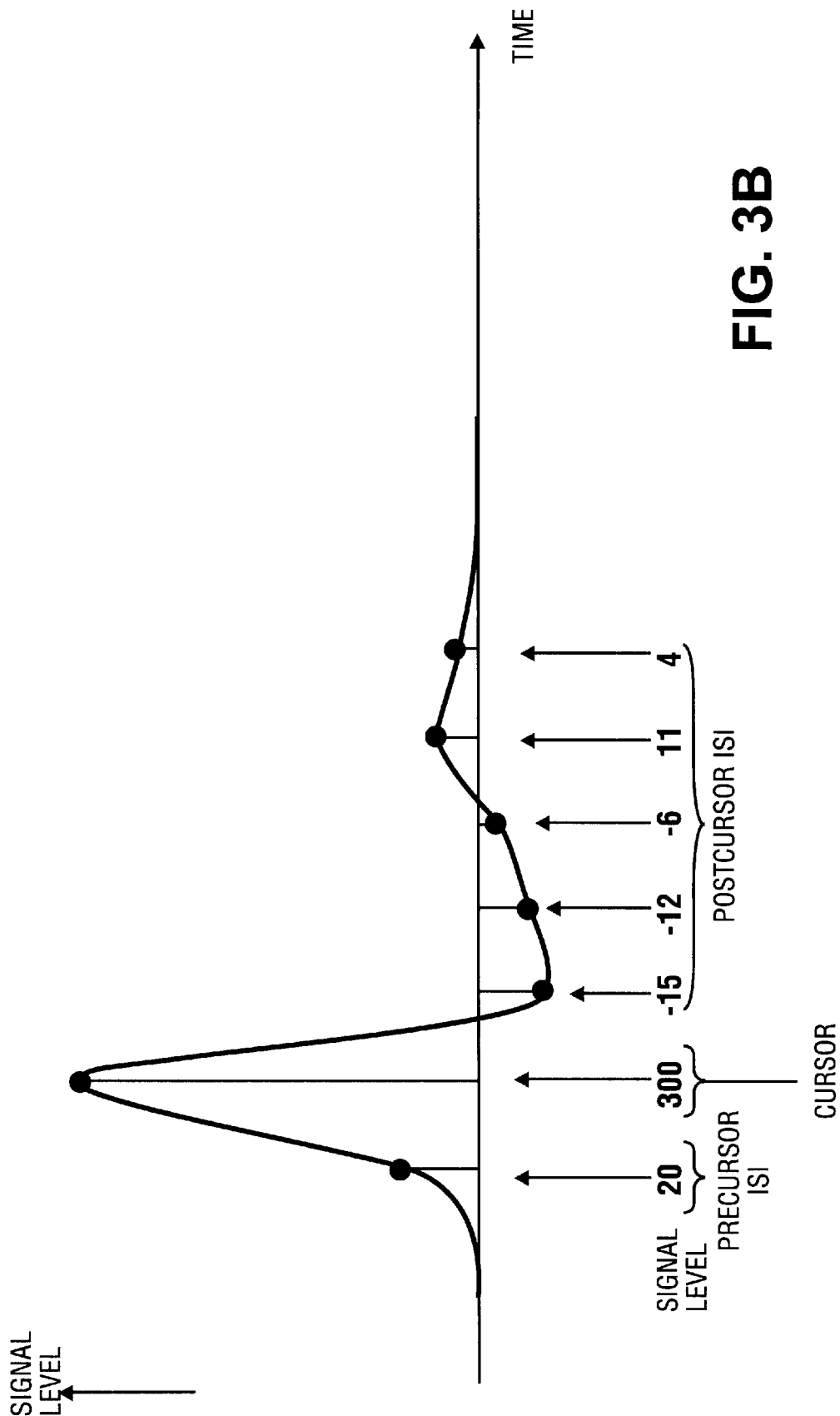
FIG. 3b shows an exemplary pulse response waveform with intersymbol interference.

Another technique for determining the reference levels in the receiver circuit so as to increase and perhaps maximize the voltage margin of the receiver in the presence of inter symbol interference (i.e., ISI) is as follows. Here, ISI is understood as referring to precursor and postcursor signal levels in a received analog transmission line signal which exhibits distortion. An example of such a signal, which has been received following the transmission of a short pulse by the driver, is shown in FIG. 3b. The pulse response is shown as it would be applied to the signal input of the VOC in the receiver circuit. The numbers refer to the level of the signal at the corresponding sample point. According to an embodiment, the sample point whose value is 300 is the 'cursor', while the previous sample point with a 20 level is termed the 'precursor'. Sample points having non-zero levels following the cursor are termed 'postcursors', where these are −15, −12, −6, +11, and +4. In contrast, should there have been no distortion, then the pulse response would have been essentially rectangular with no precursor or postcursors i.e., zero level, and a pulse amplitude slightly larger than 300.

Figure 3C:
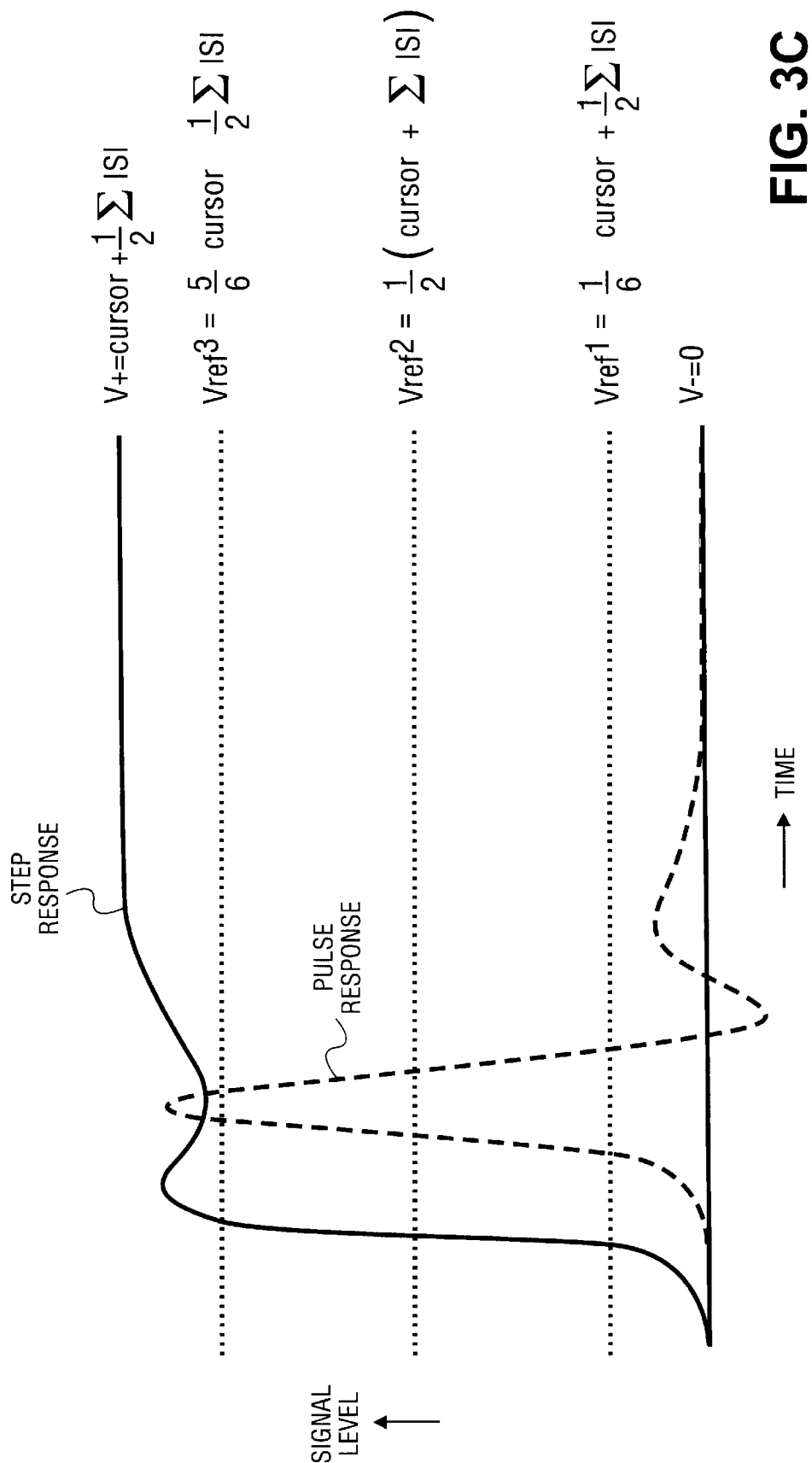
FIG. 3c depicts a graph of received pulse and step response waveforms and exemplary receiver reference level settings.

It has been determined that for a communication link which exhibits a pulse response as depicted in FIG. 3b, increased voltage margin may be obtained by selecting the VOC reference levels according to the equations given in FIG. 3c. That figure shows a step response waveform and a pulse response waveform of received analog signals that may be sampled at the signal input of the VOC. There are four symbol levels defined in this case. Symbol #0 is between V−=0 and $V_{ref\ 1}$, symbol #1 between $V_{ref\ 1}$ and $V_{ref\ 2}$, symbol #2 between $V_{ref\ 2}$ and $V_{ref\ 3}$, and finally symbol #3 between $V_{ref\ 3}$ and $V_+$. The voltage levels V− and V+ represent the nominal levels for symbol number #0 and symbol #3, respectively. In such a case, improved voltage margin is exhibited at the signal input of the VOC if the reference levels of the respective VOC 1, VOC 2, and VOC 3 are set equal to the given expressions. Thus, for the example of FIG. 3b in which the cursor level=300 and the sum of all ISI is (20−15−12−6+11+4)=2, the reference levels for the VOCs are as follows: $V_{reference\ 1}$=51, $V_{reference\ 2}$=151, and $V_{reference\ 3}$=251. Although other ways of determining the nominal settings of the reference levels are possible, the expressions shown in FIG. 3c may provide improved voltage margin for communication links which exhibit a pulse response and step response as shown.

Once all three reference levels have been determined and programmed into the three VOCs, the reference calibration period may be deemed to be completed, such that the multi-level receiver may be permitted to detect 4 PAM amplitude modulated data symbols.

In normal operation, the 4 PAM multi-level receiver may be configured to detect a symbol by translating the transmission line analog signal level into logic values at the output of the three VOCs as indicated in the third column of the table below:

| Symbol # | Analog Signal Level (Voltage) | VOC 1, VOC 2, VOC 3 (Outputs) | Encoded Output |
| --- | --- | --- | --- |
| 0 | −V | 000 | 00 |
| 1 | −V/3 | 100 | 01 |
| 2 | +V/3 | 110 | 10 |
| 3 | +V | 111 | 11 |

To provide a more efficient representation of the detected symbol values, an M-bit to P-bit, where M>P, thermometer encoder 123 (see FIG. 1) may be used as coupled to the output of the VOCs. Such an encoder provides a P-bit value in response to an M-bit value, by encoding the larger M-bit values. For the example shown in the table above, binary coding is used to yield the last column of the table which shows that each symbol can be represented by a P=2 bit number. As an alternative to binary coding, gray coding may be used in which adjacent symbols are different only by changing one bit. It should be noted that although the example above is based on a 2 bit symbol, the entire methodology (including the calibration process described above) may easily be extended to a more general form of P bits per symbol.

As was suggested above in the description of the flow diagram of FIG. 3, the analog transmission line signal level that is provided to the input of each VOC may be a sampled analog voltage held by a sampler unit 124 as shown in the embodiment of FIG. 1. This sampler unit 124 may be implemented using a conventional sample and hold circuit whose output is to provide the transmission line analog signal level. Such a sampler unit 124 may be used to reduce jitter in the received data of a clocked high speed transmission link. In such an embodiment, the sampler unit 124 would be clocked by a receiver clock signal (not shown) that may be phase and frequency locked to a driver clock signal (not shown).

In another embodiment, the sampler unit 124 is not used, and the transmission line analog signal is fed directly to each input of the VOCs 114. In that case, each input of the VOC would be receiving a continuously variable voltage, such that the VOC itself or its latched output would be timed by the receiver clock. In general, according to an embodiment, the driver data is transmitted as synchronized to a driver clock signal, while the received data is detected according to the timing provided by a receiver clock, where the receiver clock is phase and frequency locked to the driver clock. According to an embodiment, the receiver clock is derived from a received clock or strobe signal that was transmitted in sync with the data. This embodiment is also referred to as the source synchronous embodiment in which the synchronizing clock or strobe signal is transmitted on a separate transmission line than the one used for data (that is transmission line 106 in FIG. 1). According to another embodiment, the receiver clock is derived from a central reference clock that has been distributed to the driver and receiver circuits of the electronic system. Other alternatives for timing the detection of the received data are possible.

According to another embodiment, the receiver further includes transmission line termination resistors (not shown) coupled to the transmission line 106 in front of the sampler unit 124. In yet another embodiment, electrostatic discharge protection circuitry (not shown) is coupled to the transmission line 106 in front of the sampler unit 124. Other types of circuitry well known to those of ordinary skill in the art may be included in the receiver.

Figure 4:
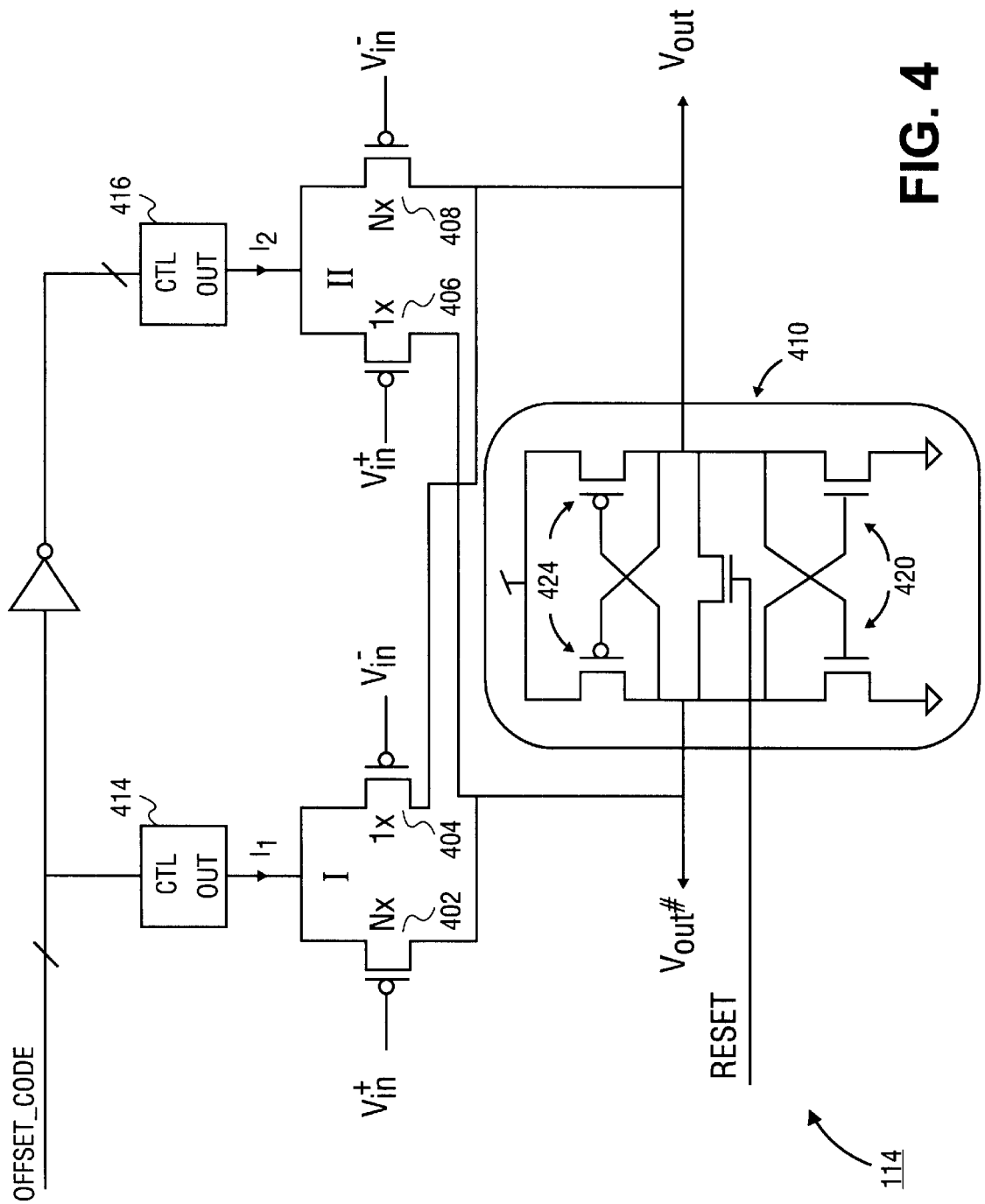
FIG. 4 shows a circuit schematic of an embodiment of the variable offset comparator.

Referring now to FIG. 4, what is shown is a circuit schematic of an embodiment of the VOC 114 as described in U.S. patent application Ser. No. 09/895,625 of Casper entitled "Variable Offset Amplifier", filed Jun. 29, 2001, and assigned to the same assignee as that of the present application. The VOC shown in FIG. 4 includes an amplifier circuit made of first and second differential pairs indicated by I and II. The first and second differential pairs are defined by transistors 402 and 404 for the first pair and 406 and 408 for the second pair. Variable current generators 414 and 416 are also coupled to control the tail currents $I_1$ and $I_2$ of the respective differential pairs. The generators 414, 416 are controlled, in this embodiment, by a digital value known as the offset code that is received on multiple, offset select lines as shown. In this embodiment, each digital value of the offset code corresponds to two oppositely varying tail currents $I_1$ and $I_2$ that are in a sense equidistant from a nominal tail current. Other schemes, however, for controlling the variable current generators 414, 416 are also possible.

Note how an input differential voltage $V_{in}^+ - V_{in}^-$ is applied to the two differential input terminals of each differential pair. Also, note how the input transistor 402 which receives $V_{in}^+$ in the first differential pair is larger than the input transistor 406 in the second differential pair. By sizing transistors 404 and 406 to be equal and transistors 402 and 408 to be equal, operation of the two differential pairs becomes symmetrical.

A single ended output voltage of the VOC may be available as either $V_{out}$ or $V_{out}\#$. To drive these output signals into one of two possible stable states needed in a digital output, a regenerative load circuit 410 may be provided as shown. After being reset by an input signal, this regenerative load circuit 410 will strongly amplify any difference between $V_{out}$ and $V_{out}\#$ that has been caused by the input differential voltage $V_{in}^+ - V_{in}^-$, where such amplification occurs at a relatively high gain due to the cross coupled N-channel pair 420 and P-channel pair 424, thereby ensuring that the output signals $V_{out}$ and $V_{out}\#$ only assume one of two possible stable states. Thus, if an input voltage is such that $V_{in}^+$ is greater than $V_{in}^-$ by at least the amount of offset that has been selected (as referred back to the input of the differential pairs) than the regenerative latch circuit 410 forcefully drives $V_{out}$ to a low voltage level and simultaneously drives $V_{out}\#$ to a high voltage level. Other types of load circuits may be used to provide the digital output signal typically associated with a comparator application.

Figure 5:
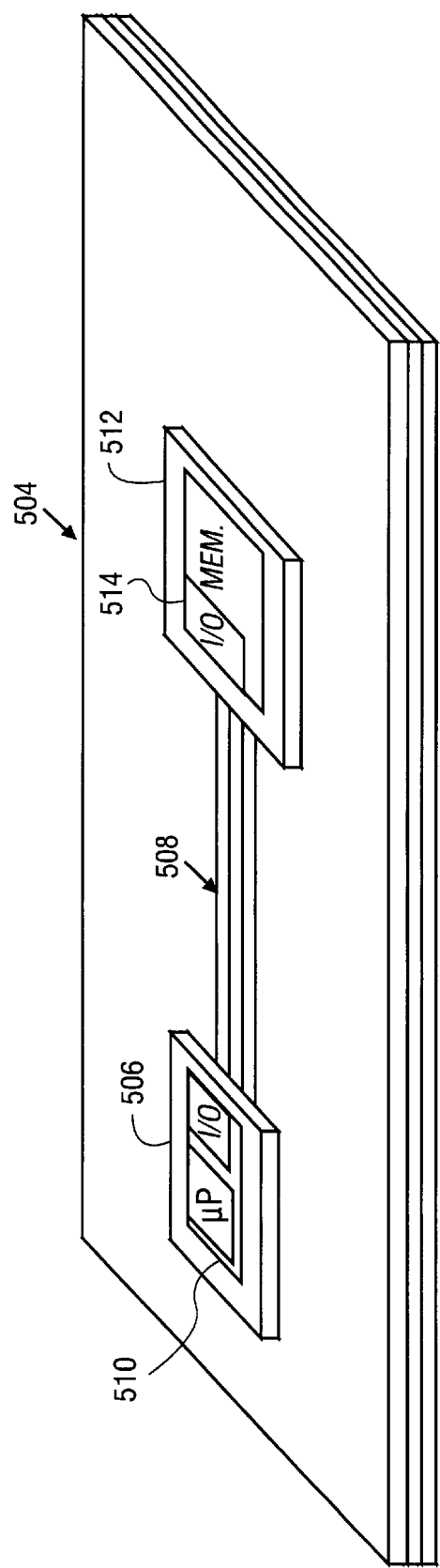
FIG. 5 depicts a block diagram of an embodiment of an electronic system in which a communication link features the multi-level receiver.

Turning now to FIG. 5, what is shown is a block diagram of an embodiment of an electronic system in which a communication link features the multi-level receiver described above. The system has a multi-layer printed wiring board 504 on which a parallel bus 508 is formed. The bus 508 may be of the point to point variety, or a multi-drop bus such as those used in a main memory. An integrated circuit (IC) chip package 506 is operatively installed on the board to communicate using the parallel bus 508. The installation of the package 506 may be done by a surface mount technique or via a connector or socket. The package has an IC chip 510 that includes a logic function section, and an I/O section as an interface between the logic function section and the bus 508. The logic function suction may be one of the following well-known devices: a microprocessor, a memory controller, and a bus bridge. Alternatively, other devices that can be implemented in the logic function section of an IC chip may be used. The I/O section has a bus receiver in which a multi-level receiver as described above is provided.

A second IC package 512 is also installed on the board 504 to communicate with the first package 506 via the bus 508. The second IC package 512 also includes a chip 514 having an I/O section in which a bus receiver is provided to interface the bus 508, and its own logic function section (here shown as a memory controller).

According to an embodiment, the I/O interfaces of the two chips 510 and 514 communicate with each other bi-directionally, that is using the same conductive lines of the bus for both transmitting and receiving data. Thus, in such an embodiment, drivers are provided, in both IC chips, that are connected to the same conductive lines of the bus 508. Other system applications of the multi-level receiver are possible, including, for example, a cable receiver.

Referring now to FIG. 6, a flow diagram of an embodiment of a computer-implemented method for designing the multi-level receiver is shown. The embodiments of the multi-level receiver described above may be designed and simulated using conventional computer-aided design and electronic design automation tools. The method involves the creation of a representation of the multi-level receiver in which a number of VOCs are provided each of which has a differential input coupled to receive a transmission line analog signal level (operation 604). Each VOC has a substantially variable offset that is controllable to represent a variable reference level inherently provided by the VOC. An example of such a VOC was described above in connection with FIG. 4. The representation of the multi-level receiver also provides at the output of each VOC a value that represents a comparison between the transmission line analog signal level and the variable reference level of that VOC.

The method also includes creating a representation of a reference calibration unit as was described above (operation 608). The capabilities of the calibration unit include the calibration of the respective reference level of each VOC by first detecting which offset codes are equal to the various symbol levels and then setting the variable offset of each comparator to represent a reference level that, according to one embodiment, is at the midpoint of two adjacent symbol levels. Once reference calibrated, the multi-level receiver is ready for normal operation to detect any one of the symbol values.

In general, the representations of all embodiments described above may be created using conventional computer-aided design and electronic design automation tools that are well known to those of ordinary skill in the art. After the representation of the loop has been created, it may be stored in digital form, as part of, for instance, a hardware description language file in a fixed or portable computer memory device, such as a hard disk drive or a compact disc. This file contains instructions that, when executed by a machine such as a computer work station, cause the machine to display and perhaps simulate operation of the multi-level receiver as part of a larger system.

Figure 7:
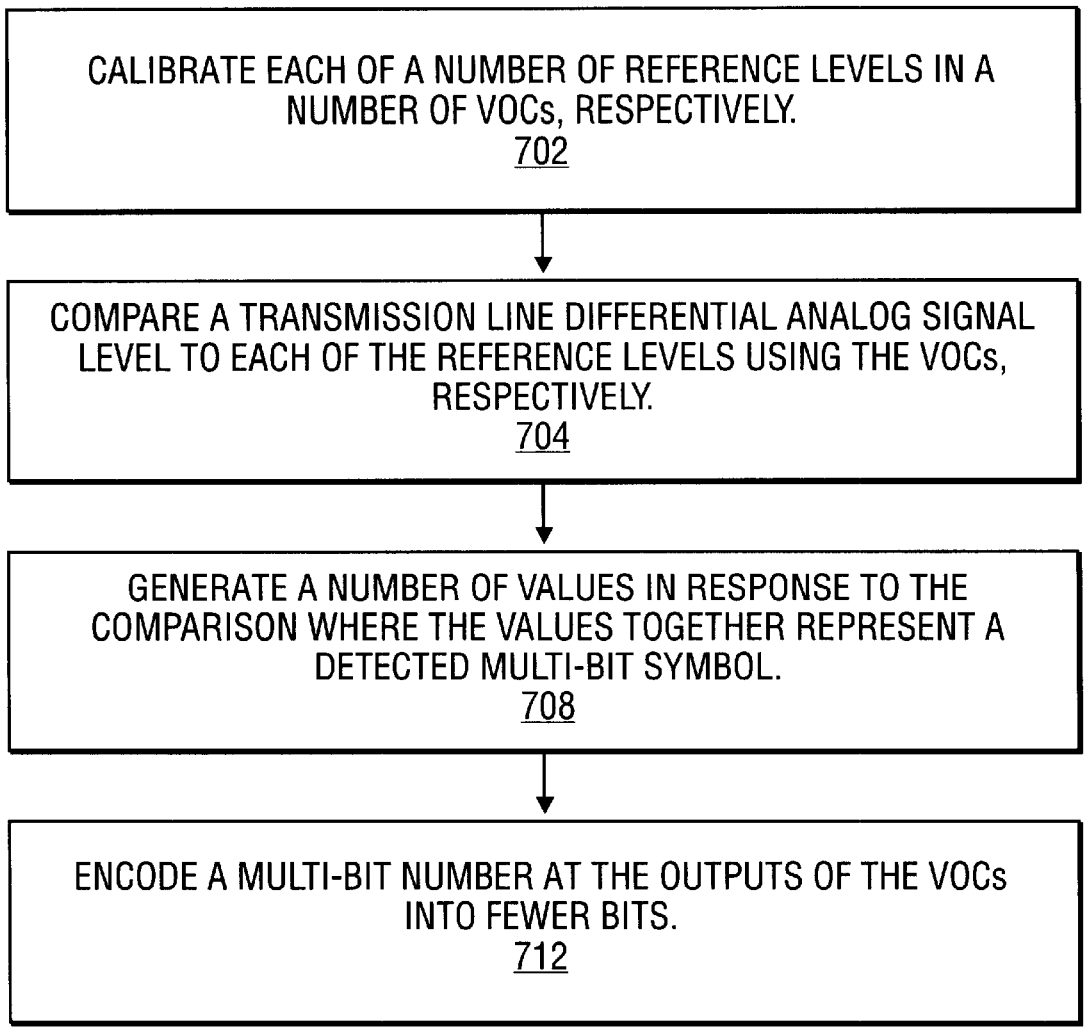
FIG. 7 shows a flow diagram of an embodiment of a process for detecting a multi-bit symbol.

Referring now to FIG. 7, what is shown is a flow diagram of an embodiment of a method for detecting a multi-bit symbol. The method begins with the calibration of each of a number of reference levels in a number of VOCs, respectively (operation 702). This may be done by setting the variable offset of each VOC to represent a separate reference level in a multi-level transmission line analog signal. For instance, the variable offset may be set according to a multi-bit binary number known as the offset code. The method then involves the comparison of a transmission line differential analog signal level to each of the reference levels, using the VOCs, respectively (operation 704). As explained above, each VOC has substantially variable offset that is controllable to represent a respective variable reference level without a separate input to receive a voltage reference level. If desired, the transmission line analog signal may be sampled and held until the comparison by the VOC is complete. The detection process continues with generation of a number of values in response to the comparison, where the values together represent a detected multi-bit symbol (operation 708). These values may be provided by the outputs of the VOCs. If desired, the multi-bit number at the outputs of the VOCs may be encoded into fewer bits (operation 712).

To summarize, various embodiments of a multi-level receiver circuit have been described. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A receiver circuit comprising:
   a plurality of comparators each of which has a differential input coupled to receive a transmission line analog signal level, each comparator has substantially variable offset that is controllable to represent a respective variable reference level without a separate input to receive a voltage reference level, an output of each comparator is to provide a value that represents a comparison between the transmission line analog signal level and the respective reference level; and
   a reference calibration unit whose output is coupled to an offset control input of each comparator and whose input is coupled to the output of each comparator, the calibration unit being able to calibrate the respective reference level of each comparator by setting the variable offset of each comparator to represent a separate symbol level in a multi-level transmission line analog signal.

2. The receiver circuit of claim 2 wherein the offset control input of each comparator is to receive a multi-bit binary number.

3. The receiver circuit of claim 2 further comprising:
an M-bit to N-bit thermometer encoder where M>N, coupled to the outputs of the plurality of comparators to provide an N-bit value in response to an M-bit value at the outputs of the plurality of comparators.

4. The receiver circuit of claim 1 further comprising:
a sample and hold circuit whose output is to provide the transmission line analog signal level.

5. The receiver circuit of claim 1 wherein each of the plurality of comparators includes first and second differential transistor pairs each being intentionally unbalanced, each pair having first and second output nodes, the first output node of the first pair being coupled to the second output node of the second pair, the second output node of the first pair being coupled to the first output node of the second pair, and first and second variable current generators coupled to control respective tail currents of the first and second differential pairs.

6. A method for detecting a symbol, comprising:
comparing a transmission line differential analog signal level to a plurality of reference levels using a plurality of comparators, respectively, each comparator having substantially variable offset that is controllable to represent a respective variable reference level without a separate input to receive a voltage reference level;
generating a plurality of values in response to the comparison, the values together representing a detected multi-bit symbol; and
calibrating each of the plurality of reference levels by setting the variable offset of each comparator to represent a separate reference level in a multi-level transmission line analog signal.

7. The method of claim 6 wherein the variable offset of each comparator is set according to a multi-bit binary number.

8. The method of claim 6 wherein the plurality of values that together represent the detected multi-bit symbol are M bits long, the method further comprising encoding the M bits into N bits, where M>N.

9. The method of claim 6 further comprising sampling a multi-level transmission line analog signal to obtain the transmission line analog signal level.

10. An electronic system comprising:
a printed wiring board on which a parallel bus is formed, an integrated circuit (IC) chip package being operatively installed on the board to communicate using the parallel bus, the package having an IC chip that includes a logic function section and an I/O section as an interface between the logic function section and the bus, the I/O section having a bus receiver in which there are a plurality of comparators each of which has an input coupled to receive a transmission line analog signal level, each comparator has substantially variable offset that is controllable to represent a respective variable reference level and without a separate input to receive a voltage reference level, an output of each comparator is to provide a value that represents a comparison between the transmission line analog signal level and the respective reference level,
wherein the bus receiver further includes a reference calibration unit whose output is coupled to an offset control input of each conparator and whose input is coupled to the output of each comparator, the calibration unit being able to calibrate the respective reference level of each comparator by setting the variable offset of each comparator to represent a separate symbol level in a multi-level transmission line analog signal.

11. The electronic system of claim 10 wherein the logic function section is a microprocessor.

12. The electronic system of claim 10 wherein the logic function section is a memory controller.

13. The electronic system of claim 10 wherein the logic function section is a bus bridge.

14. An article of manufacture comprising:
a machine-readable medium having instructions stored thereon which, when executed by a processor, cause an electronic system to display a representation of a multi-level receiver in which there are a plurality of comparators each of which has an input coupled to receive a transmission line analog signal level, each comparator has substantially variable offset that is controllable to represent a respective variable reference level without a separate input to receive a voltage reference level, an output of each comparator is to provide a value that represents a comparison between the transmission line analog signal level and the respective reference level,
a reference calibration unit whose output is coupled to an offset control input of each comparator and whose input is coupled to the output of each comparator, the calibration unit being able to calibrate the respective reference level of each comparator by setting the variable offset of each comparator to represent the midpoint between two adjacent symbol levels.

15. The article of manufacture of claim 14 wherein the medium includes further instructions which, when executed by the processor, cause the representation of the offset control input of each comparator to be receiving a multi-bit binary number.

16. The article of manufacture of claim 14 wherein the medium includes further instructions which, when executed by the processor, cause the representation of the multi-level receiver to further include an M-bit to N-bit thermometer encoder, where M>N, coupled to the outputs of the plurality of comparators to provide an N-bit value in response to an M-bit value at the outputs of the plurality of comparators.

17. The article of manufacture of claim 14 wherein the medium includes further instructions which, when executed by the processor, cause the representation of the multi-level receiver to further include a sample and hold circuit whose output is to provide the transmission line analog signal level.

18. The article of manufacture of claim 14 wherein the medium includes further instructions which, when executed by the processor, cause the representation of each of the plurality of comparators to include first and second differential transistor pairs each being intentionally unbalanced, each pair having first and second output nodes, the first output node of the first pair being coupled to the second output node of the second pair, the second output node of the first pair being coupled to the first output node of the second pair, and first and second variable current generators coupled to control respective tail currents of the first and second differential pairs.

* * * * *

UNITED STATES PATENT AND TRADEMARK OFFICE
CERTIFICATE OF CORRECTION

PATENT NO. : 6,617,918 B2  Page 1 of 1
DATED : September 9, 2003
INVENTOR(S) : Casper It is certified that error appears in the above-identified patent and that said Letters Patent is hereby corrected as shown below:

<u>Column 5,</u>
Line 46, delete "M>P", insert -- M<P --.

Signed and Sealed this

Second Day of March, 2004

JON W. DUDAS
*Acting Director of the United States Patent and Trademark Office*